United States Patent [19]

Héroux

[11] Patent Number: 5,151,649
[45] Date of Patent: Sep. 29, 1992

[54] PAIR OF ELECTRICALLY SHIELDED TRIAXIAL MAGNETIC SENSORS FOR DETERMINATION OF ELECTRIC CURRENTS IN CONDUCTORS IN AIR WITH DISTANCE AND ANGLE COMPENSATION

[76] Inventor: Paul Héroux, 921 Jean-Paul Vincent, apt 6, Longueuil, Québec, Canada, J4G 1V1

[21] Appl. No.: 680,826

[22] Filed: Apr. 5, 1991

Related U.S. Application Data

[63] Continuation-in-part of Ser. No. 468,628, Jan. 23, 1990, abandoned.

[51] Int. Cl.$^5$ .................... G01R 19/00; G01R 19/08; G01R 33/022
[52] U.S. Cl. .................. 324/127; 324/117 R; 324/245; 324/247; 364/483
[58] Field of Search ............... 324/117 R, 117 H, 127, 324/245–247, 67, 326, 331, 345; 364/483

[56] References Cited

U.S. PATENT DOCUMENTS

| | | | |
|---|---|---|---|
| 4,309,659 | 1/1982 | Yoshii | 324/326 X |
| 4,427,943 | 1/1984 | Cloutier et al. | 324/326 |
| 4,438,401 | 3/1984 | Iwamoto et al. | 324/326 |
| 4,542,344 | 9/1985 | Darilek et al. | 324/326 |
| 4,672,321 | 6/1987 | Howell | 324/326 |

FOREIGN PATENT DOCUMENTS

| | | | |
|---|---|---|---|
| 0137265 | 10/1981 | Japan | 325/326 |
| 2070783 | 9/1981 | United Kingdom | 324/326 |

Primary Examiner—Gerard R. Strecker

[57] ABSTRACT

Two groups of magnetic field transducers shielded from electric fields and at a known distance from each other are contained in a portable instrument. Each group consists of 3 magnetic field transducers each sensitive to the magnetic field at a single point but according to three orthogonal orientations. Rapid reading of the magnetic field values measured by all 6 coils allows evaluation of the current in a straight electrical conductor relatively near to the apparatus on the basis of the direction and amplitude of the magnetic field vectors measured at the position of each group of 3 coils. Assuming that the conductor under scrutiny is the dominant magnetic influence in the area, the determination of both current and distance of the conductor is exact within a wide range of distances between apparatus and conductor and within a large number of orientations of the apparatus with respect to the conductor because of internal computational compensations performed by a microprocessor.

2 Claims, 3 Drawing Sheets

PAIR OF ELECTRICALLY SHIELDED TRIAXIAL MAGNETIC SENSORS FOR DETERMINATION OF ELECTRIC CURRENTS IN CONDUCTORS IN AIR WITH DISTANCE AND ANGLE COMPENSATION

This patent application is a continuation in part of pending U.S. patent application 07/468,628 filed Jan. 23, 1990, now abandoned.

BRIEF SUMMARY OF INVENTION

My invention consists of a self-contained portable measuring instrument with the capacity to make precise measurements of currents in straight conductors in air using a pair of triaxial magnetic flux density sensors shielded against electric fields. It is capable of making accurate current measurements at variable distances from and is not dependant on precise angular alignment of the instrument in relation to the electrical conductor being investigated. If interfering fields making the determination inaccurate are detected by the instrument, its display goes blank or a warning issued to the operator to prevent inaccuracies.

BRIEF DESCRIPTION OF VIEWS OF DRAWINGS

DETAILED DESCRIPTION OF INVENTION

Background

Figure 1:
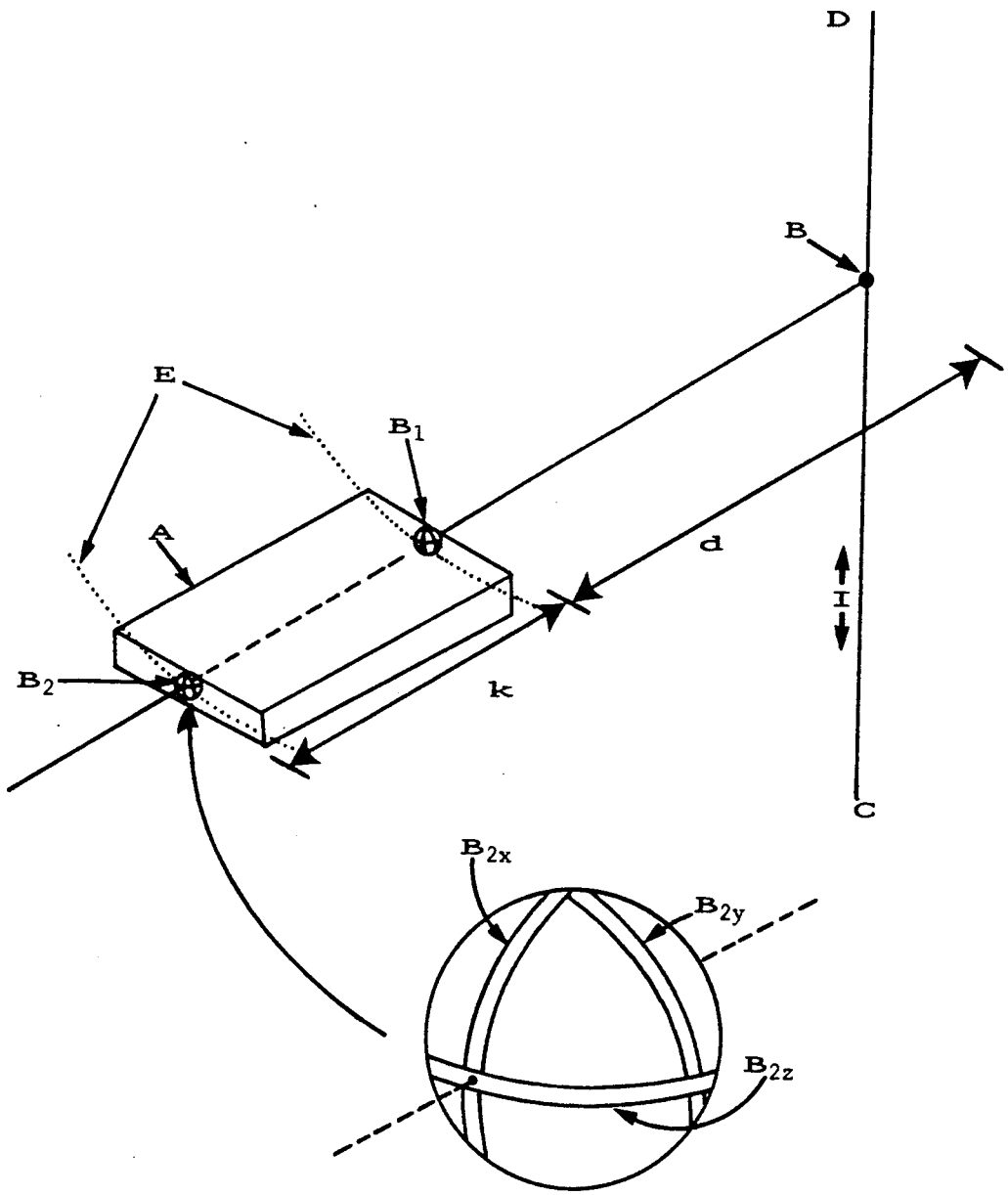
FIG. 1 shows the apparatus with its main axis perpendicular to an electrical conductor together with an enlarged view of one of the pair of Triaxial Magnetic Field transducers, embodied here as coils of wire, placed along the 3 orthogonal directions within the apparatus.

The measurement of the electrical current carried by a conductor has always necessitated the introduction of a shunt in series with the conductor or of a magnetic clamp closed around the conductor. The motive to measure electric currents without actual contact may become particularly important in conductors under high voltage, as contacting such conductors always involves safety issues. Although it is possible to evaluate electric current from the magnitude of the magnetic field at a given distance from a conductor, this method has never been applied widely because the distance between conductor and detector is not necessarily known to the desired accuracy, cannot conveniently be kept fixed, and/or because the angle of the magnetic field transducer axis with respect to the conductor axis is not accurate or constant. These inconveniences are especially true for hand-held survey instruments. Further, when the conductor is in the air, it is surrounded by an electric as well as a magnetic field. If the magnetic coils are not shielded against the electric field, the signal received will reflect both fields rather than the magnetic field alone.

Previous Art

Previous art describes arrays of magnetic detectors for the purpose of homing in on buried or underwater conductors and cables or for evaluating surface corrosion on pipelines through electric current losses in the soil in the form of two separated coils or pairs of coils given a vertical or horizontal orientation. These instruments do not aim at precise current measurement, but rather are homing devices to localize cables or differential-current devices to determine whether the electrical insulation of pipelines or cables has yielded, which is an indication of corrosion. All previous art uses extended antennas or structures for transducer support, a specific orientation of the transducers with respect to the earth, magnetic coils unshielded from the electric field, and are not supported by electronics designed for exact, absolute current determinations. Unshielded coils are adequate for measurement of magnetic fields from magnetic sources within the ground, but would be ineffective in the case of a conductor in air since the electric field originating from an electrical conductor in air would interfere with magnetic measurements.

Howell [U.S. Pat. No. 4,672,321] describes an antenna and mounting framework with coils in substantially different vertical planes. The coils are at right angles and held horizontal, and the purpose of the invention is to eliminate the requirement for the operator in the process of cable detection, to rotate the coil arrangement about a vertical axis and of "the need for the antenna to be located directly overhead" of the cable in the case of a third coil. Omnidirectionality was not on the mind of the inventor because his proposal and claims require explicitly the operation of the apparatus in a vertical orientation. Further, the device was not envisioned as an absolute current meter, but as a means to measure current differences between two locations, and this is why it displayed results in units of milliBell per meter or %/m. Still further, the apparatus could not have been envisioned as a measuring instrument for aerial electrical conductors: the instrument described would not work in the measurement of the current in an aerial electrical wire because the unshielded magnetic field coils would also pick up the electric field from such a wire. As I point out below, the coils must be shielded against the electric field.

Darilek [U.S. Pat. No. 4,542,344] describes, similarly to Howell, an antenna made of a rod several feet long, but with detectors disposed horizontally and straddling the pipeline. As for Howell, the apparatus is used in a specific orientation, that is, was not conceived for omnidirectional detection. Omnidirectionality of detection is not a requirement for pipeline work, and Darilek uses only two sets of two unshielded transducers. Again, the instrument was not viewed as an absolute, but a relative current meter.

Iwamoto [U.S. Pat. No. 4,438,401] describes a homing system to detect cables buried in the seabed supported by injection of a known current into the cable. A single triaxial magnetic detector is carried by a vehicle with one of the detector elements being directed in the vertical direction. This device, contrary to my own, is not enclosed or self-contained [the transducer is separate from the electronics], is not portable, is not a measuring instrument for current, contains only one triaxial transducer rather than two, and is used in a prescribed orientation underwater. A major philosophical difference is that it is designed to give vectorial information to a ditching machine for homing on the position of an underwater cable through which current is passed. My own design is fundamentally an omnidirectional device for measuring unknown currents in electrical conductors in air, and as such must have absolute calibration.

Cloutier [U.S. Pat. No. 4,427,943] describes a vehicle-based homing system used in providing directional information for locating magnetic objects or sources using two pairs of magnetic transducers. The apparatus is made to be used horizontally in a vehicle above the seafloor and is therefore not omnidirectional in its concept: " . . . all the magnetic axes may be turned 90 degrees in a horizontal plane, but the orientations shown are preferred". The instrument functions basically with a pair of single transducer coils only. When the apparatus is enhanced to function with a pair of 2 transducer coils, Cloutier does not attempt to measure magnetic field vectors at two points in space by locating identically the centers of the orthogonal coils so that the determination of the magnetic field vector at that point is exact. Further, no determination of a vector by means of summing vectorially the axis components $[(x^2+y^2+z^2)^{\frac{1}{2}}]$ is attempted. It can be seen in FIG. 7 that the signal from individual coils are simply added using the summation amplifier 34. Following the circuit, the signal from the left and right gradiometers are again added using the differential amplifier 42. Clearly, there is no attempt at vectorial analysis, but a pick-up of signal for directional information.

In my proposal, not only is the information for all magnetic field components retained and analyzed vectorially, but special computations for the estimation of current in a conductor are carried out which involve the ratio of two magnetic field intensities [as shown in equations below]. Cloutier is not concerned with measurements of currents but only with obtaining an approximate signal to home in on a buried conductor. Therefore, omnidirectionality is not desirable, and it is insufficient to use the difference in the absolute values of the signals of two magnetic transducers apart in space.

Theory supporting my apparatus

Goal

I am attempting to describe a measurement instrument meeting the minimum requirements for detection of the current flowing in a long straight conductor. It is embodied as a small portable omnidirectional device, that is, capable of accurate current determination without the need for an accurate, specific orientation in space relative to the conductor, and is also capable of compensating for distance to the conductor so that an accurate measurement of the electric current in the conductor can be obtained with minimum operator intervention.

Fields from the Conductor

The Biot-Savart Law states that the current flowing in a long straight conductor produces a magnetic field which has flux vectors in a plane perpendicular to the axis of the conductor, in circles concentric with the conductor. The magnetic flux density at any point is directly proportional to the current amplitude and inversely proportional to the shortest distance to the conductor.

Apart from the magnetic field any conductor in air passing current, even if covered with plastic insulation, is surrounded with an electric field. Contrary to the magnetic field, the electric field is distorted by conductive bodies, particularly a person holding an instrument, and the instrument itself. A magnetic detection coil although not specifically designed to detect electric fields, is still sensitive to them. There are two reasons for this. First, the impedance to ground of the detecting electronic circuitry is never exactly symmetrical and second, the two halves of a wire loop cannot be wound perfectly symmetrically on a coil. In the most frequent configuration, one pole of the coil is led to a common potential, while the other is led to the base of a transistor which is part of an integrated circuit. Some circuits may have a truly differential structure, the two poles of the coil being led both to the base of transistors, but the transistors not being absolutely identical in impedance, differential sensitivity results. The asymmetry of the coil winding allows one of the half wires to function as an antenna for the electric field. The net effect of these limitations is that if the magnetic coil is subjected to an electric field, a differential signal will be detected because of imbalanced impedance loading and of asymmetries in the coil. In the case of a conductor which is shielded by some conducting object such as seawater or the earth, the electric field influence is eliminated because such objects are functionally grounded. However, construction of an exact, sensitive measuring instrument could not proceed without shielding magnetic coils from electric field influences, particularly as in the application I describe, the instrument is being brought in relative proximity to conductors under substantial voltage.

Minimum Requirements

Omnidirectional magnetic flux density detection absolutely requires triaxial arrays which consists of 3 identical and independent detectors [such as Hall effect probes] or coils arranged co-centrally and orthogonal to one another, because it is the only sensor allowing instantaneous determination of all 3 components of a vector in 3-dimensional space. The same measurements could be achieved with a single transducer successively oriented by an operator in 3 orthogonal directions, but this does not result from my point of view in a useable omnidirectional instrument. An omnidirectional detector such as the one I propose cannot operate without 3 orthogonal coils at each measuring position. A triaxial detector is able to detect accurately a vector in space independently of its orientation with respect to the vector itself. In fact, if vectorial summation is performed on the outputs of magnetic coils arranged as a triaxial detector, induction of the earth's constant magnetic field in the coils is eliminated in the summed output even in the presence of any rotation of the coil array, because geomagnetic induction in one coil is compensated exactly by geomagnetic induction in the two other coils.

From the point of view of the instrument I am trying to define, determination of currents in a conductor requires knowledge of conductor position and current intensity. Conductor position can be defined exactly in space by 6 coordinates $x_1$, $y_1$, $z_1$, $x_2$, $y_2$, $z_2$, [the coordinates of the 2 points traversed by the conductor]. This makes, including current, altogether 7 variables, more than can be determined by a pair of triaxial transducers spaced apart [2×3 variables]. This shortcoming of a pair of triaxial detectors is easily illustrated by the following case. When the axis joining the two points of vectorial detection in the measuring instrument is exactly parallel to the axis of the straight electrical conductor, the vectors determined at the two measuring positions will be identical in intensity and direction.

This means that the vectors will not converge to define the position of the conductor. Without a known position for the conductor, there is no hope of calculating the current from distance and magnetic field density and the problem is unsolved. To meet my goal of omnidirectional detection, a third measurement point must be added. Therefore, the minimum arrangement for omnidirectional detection of currents flowing in conductors must involve determination of magnetic field vectors at 3 different positions which are not located on a straight line [non-colinear].

A practical omnidirectional instrument

From the above it is assumed that an omnidirectional detector for a straight conductor carrying an electrical current requires 3 magnetic field measurement points disposed, say, on an equilateral triangle. Those requirements are rather heavy because the instrument housing the detectors should inevitably enclose a triangular surface, resulting in a substantially enlarged casing. Also, an increased number of signals places larger demands on multiplexing and interpretation of signals, requiring heavier electronics and more microprocessor time. I have therefore examined means of doing away with the third detector, which would allow a more compact, economical and faster instrument.

Because in work above ground the conductor is in full view, I reasoned that it is easy for the operator to avoid placing his measuring instrument with its long axis [which is coincident with the line between triaxial detectors] exactly parallel to the conductor. Fulfilling this requirement would allow determination of currents with only 2 transducers, and a better and cheaper instrument could be made, while maintaining some important advantages of omnidirectionality. If the instrument I propose is to compete with classical methods of measuring currents in conductors, it is unacceptable that the current reading given fluctuate according to small angular changes in the orientation of the instrument with respect to the electrical conductor. Therefore, the instrument must be capable of compensating accurately and rapidly for any angular change. I have found that in practice, given, the limitations on the accuracy of magnetic transducers and of algorithms implanted in microprocessors to correct for instrument misalignment, the conductor's axis and that of the main axis of the instrument should be at 90 degrees, plus or minus 45 degrees to insure accuracy. This means that fully half of all possible orientations of the instrument with respect to the axis of the conductor are useable for readings. Fortunately, it is also possible to detect the situation in which conductor and instrument axis are parallel from vectorial analysis, and the instrument's display can be blanked in those cases. This mode of operation insures a relatively simple instrument with all the functionality of an omnidirectional detector. Interestingly, should a conductor be hidden from view, the warning given to the operator can be interpreted not as an inaccuracy warning, but as an indication to re-orient his instrument for proper determination.

Preferred embodiment

The two triaxial magnetic assemblies are located inside a portable housing made of any non-magnetic material.

Figure 3:
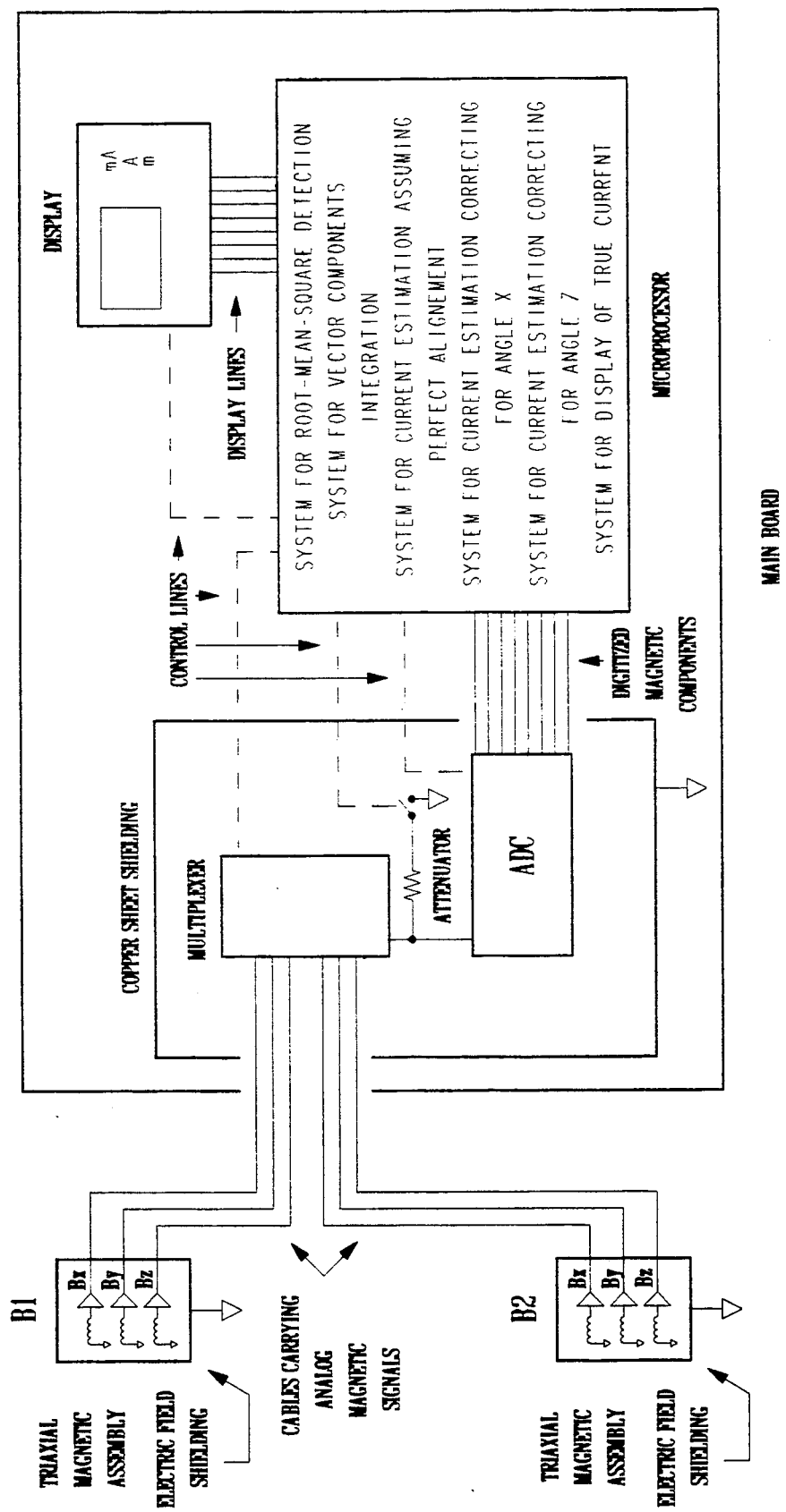
FIG. 3 shows in block diagram form the relations between the main components of the proposed instrument, including shielded coils, multiplexer-ADC electronic circuits as well as microprocessor and display unit.

It is advantageous to localize the two triaxial assemblies at a distance as large from one another as possible because the apparatus uses the amplitude ratio between the magnetic vectors at the two positions to compute the current. If the locations are excessively close, the magnetic field ratio becomes close to 1 in a given field gradient and the current determination becomes less accurate [that is due to the denominator written as $(B1/B2-1)$ in the expression for current, as will be discussed below], considering the accuracy limits of the electronic circuits in determining magnetic vector amplitudes. In the embodiment shown in FIG. 1, the two triaxial magnetic assemblies are located symmetrically within the instrument housing and at a maximum distance from each other along the main axis of the instrument. The 3 magnetic transducers or coils which are included in each of the two assemblies (refer to FIG. 3) must be substantially miniaturized for the application. It is convenient to mount the coils which may be of circular, square or other section on a support block or sphere. Precision of current determinations is influenced by coil alignment so it is important that the coil axes be strictly aligned through precisely orthogonal, narrow grooves in the support block or sphere. A proper coil construction would consist of 3 orthogonal coils 3 cm in diameter or on a side made each with 2000 turns of American Wire Gage 54 caliber varnished copper wire. It is also convenient to include within the hollowed block operational amplifiers, the commonly available OP-20, a low-noise, low power operational amplifier with 114 dB dynamic range being suitable and available individually or as a quadruple surface-mount format. These amplifiers are located close to the transducers to avoid other electromagnetic signals which could interfere with small magnetic signal pickup. Depending on the accuracy of the instrument desired, a choice must be made between individual coil shielding or shielding of all 3 coils within a single conductive envelope For this purpose, I have used easily bendable sheet brass, soldered at the edges in the shape of a closed box for collective shielding, or for individual coil wrapping brass foil wound around the coils themselves. The foil or sheet shielding is connected to the ground shield of a multi-conductor cable which brings in the power supply for the operational amplifiers included within the shield to strengthen the magnetic signal before transmission to the electronics board, and brings out the voltage signal generated by the 2000 turn coils. Note that it is preferable that the operational amplifiers be contained within the shields, whether individual or collective shielding is preferred. Each operational amplifier assigned to each coil is placed on a small circuit board to allow support of the precision resistors determining the circuit gain, as well as a filtering circuit using capacitors and resistors to restrict the frequency response of the circuits within a given frequency band, and so increase the signal-to-noise ratio. In the most common case, and for detection of industrial frequency currents, the central frequency of such notch filters is 50 or 60 Hz.

Both triaxial magnetic assemblies, each situated at one extremity within the instrument enclosure, are able to determine exactly the magnetic flux vector at that point. The time-varying sinusoidal magnetic flux originating from the conductor passes through each of the orthogonal coils and generates, through the laws of electromagnetic induction, an electromotive force which is amplified and filtered by the 6 operational amplifiers and transmitted as an ac voltage signal through 6 cables towards the main board unit which assumes the function of integrating the 6 signals and interpreting their meaning. In delicate measuring applications, it will be found desirable to enclose parts of the main board within an envelope of copper to protect sensitive circuits from microprocessor noise which tends to degrade the performance of many low-signal detector circuits. Such a shield is in the form of a closed copper sheet of some thickness which is shaped into a box and welded shut, but with access holes for battery power, control and output lines to the microprocessor and display of readings on low power liquid crystal numerals, and access for the 6 signal cables.

I have used two different designs for the main board unit, both of which present advantages. In the first technique, the 6 ac signals representing the magnetic flux density at vector locations 1 and 2, $B_{1x}$, $B_{1y}$, $B_{1z}$, $B_{2x}$, $B_{2y}$ and $B_{2z}$, are integrated vectorially using analog circuits. This has the advantage of eliminating the induction into the system of coils from movement of the coils in relation to the earth's magnetic field, but the disadvantage of increasing the drain on the battery powering the system because of the presence of extra circuitry. If the analog vectorial circuitry integration is included into the apparatus, it is effected in the classical way: the amplitude of the magnetic field vector at locations 1 and 2 is expressed as $(B_x^2 + B_y^2 + B_z^2)^{\frac{1}{2}}$. For each of the 3 vectorial components originating from the same measurement position [1 or 2], each of the three signals is connected to the input of an integrated circuit such as the Intersil ICL8013 configured to square the signal. The squared output of these 3 circuits are added by a summing circuit such as the LM308AH. The output of this last circuit is then taken by another ICL8013 circuit, but this time configured for the square root function. At this point, the output voltages available from the 2 electronic systems assigned respectively to integration of vectors 1 and 2 represent the magnetic flux vector intensity $B_1$ or $B_2$, with all magnetic components integrated. This vector amplitude is entirely independent of apparatus orientation in space. In the alternate design not including the analog circuit in the instrument, the same integration function can be performed by the combination of an analog-to-digital converter coupled to a microprocessor. The 6 ac signals representing individual components are then connected sequentially through a multiplexer to an ADC circuit which translates the amplitude of the ac signal into 6 root-mean-square values. Taken 3 by 3, the values can be numerically integrated using the same formula. $B_n = (B_{nx}^2 + B_{ny}^2 + B_{nz}^2)^{1/8}$, all within a small fraction of a second. As mentioned above, the disadvantage of the all digital technique is that sensitivity to movement within the earth's magnetic field cannot be kept as low as in the analog case, even by using powerful notch filters designed to eliminate low frequency signals both at the magnetic transducers themselves and in filtering buffers added for that purpose before the multiplexer circuit, and that the measurements are not truly simultaneous because of multiplexing, resulting in slight inaccuracies. In the rest of this discussion, the two cases, analog integration, and digital integration, will not be distinguished further, as it is understood that the main difference between them lies in a question of susceptibility to operator movement and that choice between the two techniques depends upon the applications foreseen by the user and his requirements for precision in specific circumstances. The treatment of signals is also fundamentally similar. In the analog integration method, the signals available to the ADC for conversion are $B_1$, $B_{1x}$, $B_{1y}$, $B_{1z}$, $B_2$, $B_{2x}$, $B_{2y}$ and $B_{2z}$, while in the digital conversion method the signals are $B_{1x}$, $B_{1y}$, $B_{1z}$, $B_{2x}$, $B_{2y}$ and $B_{2z}$, $B_1$ and $B_2$ being computed from their 3 vectorial components To use the information from the two triaxial assemblies, the six signals are connected in turn through a multiplexer to an analog-to-digital converter which transforms the sinusoidal waveshapes into root-mean-square values.

It should be noted that it was found desirable to include a calibrated attenuator at the ADC input which could be switched in under microprocessor control so as to optimize dynamic range, this being a common technique in electronics, and not affecting the method in which the instrument proceeds. The techniques described here for the detection of magnetic fields are effective for measuring magnetic fields of 60 Hz frequency between as little as 1 nT and as much as 100 μT, essentially unperturbed by electric fields.

The ADC sweeps the 6 [or 8, in the case of the analog integration technique] input channels and keeps the converted numerical values in memory for further computations. The values are updated continuously by the ADC which signals the microprocessor to analyze the data deposited into its memory each time a conversion run is terminated. The computer analyzes the data by running software developed specifically for that purpose by a person skilled in the art and kept permanently within the instrument in a programmable read-only memory. The principles of the computation will be exposed here, rather than microprocessor code.

In order to illustrate the procedure followed by the microprocessor, two examples of current determinations in a conductor will be given. The first is very simple, and will allow the reader to follow easily the steps without having to keep track of quantitative considerations related to angle compensation.

Given a straight electrical conductor, depicted in FIG. 1 at C-D, passing an ac current I, the magnetic field density at any point will have an intensity determined by $B = a \, I/d$, where B is the magnetic field, I is the current, d is the distance and a is a unit constant.

The detection apparatus [A] in this first example has its main axis [line $B_2$-$B_1$-B] exactly perpendicular to the electrical conductor [C-D]. Distance between $B_2$ and $B_1$ is k, distance between $B_1$ and B is d. Curves E show magnetic lines of force passing through $B_1$ and $B_2$, which are the sites where the triaxial magnetic transducers are located.

The enlarged view shows the Triaxial Magnetic Field Transducer at position $B_2$, depicted here as 3 exposed circular coils of wire, identified as $B_{2x}$, $B_{2y}$ and $B_{2z}$, and placed along the 3 orthogonal axes of the apparatus. In the particular situation depicted here, coil $B_{2y}$ is receiving no induction signal because its main axis is parallel to the line $B_2$-$B_1$-B [therefore the signal read by the microprocessor for $B_{2y}$ will be 0]. The reading of the apparatus is indifferent to rotations about axis $B_2$-$B_1$-B because the readings of coils $B_{2x}$ and $B_{2z}$ are summed vectorially by the microprocessor program $[(B_{2x}^2 + B_{2y}^2 + B_{2z}^2)^{\frac{1}{2}} = B_2]$ to supply a resulting field amplitude $B_2$. The same is done at position $B_1$. As was mentioned previously and as known from the theory of vector analysis, a triaxial detector can detect a vector in tri-dimensional space using any detector orientation with the same accuracy.

If then the magnitude of the magnetic field at position $B_1$ is computed by the microprocessor as $B_1$ and if the magnitude of the magnetic field at position $B_2$ is computed in a similar way as $B_2$, the equation below can be used to compute the current flowing in the conductor as $$I = k\, B_1/20((B_1/B_2) - 1)$$

and the distance to the conductor as
$d = k/((B_1/B_2) - 1)$.

It can easily be arranged for a person skilled in the art to program the microprocessor to retrieve the value of k from a program, use the values of $B_1$ and $B_2$ supplied by the ADC and compute I and d from the above equations. The above expressions were derived from the two simple equations $B_1 = 20I/d$ and $B_2 = 20I/(d+k)$ which are simply the Biot-Savart law mentioned above. I is in Ampere, k and d in centimeters and B in microTesla.

Having performed the calculation, the instrument proceeds to activate a display visible to the operator informing him of the measured current value, and if required through a pushbutton, of the distance to the conductor.

However, an instrument performing simply the above functions would not be particularly useful because it would have to be strictly aimed at the conductor, and would show fluctuating values even with slight angular movements of the instrument. It is therefore desirable that the instrument display always the same current value even if the misalignment of the instrument towards the conductor is substantial. The methods used for this purpose are described below.

Techniques to compensate misalignment

It has already been mentioned that rotation of the apparatus about axis $B_2$-$B_1$-B has no effect on the reading because of the vectorial sum performed by the microprocessor. To fully compensate for any orientation of the apparatus, two other angles must be considered. To simplify the discussion, I will illustrate the microprocessor procedure and calculations for one of the two angles, G, as shown in FIG. 2.

Figure 2:
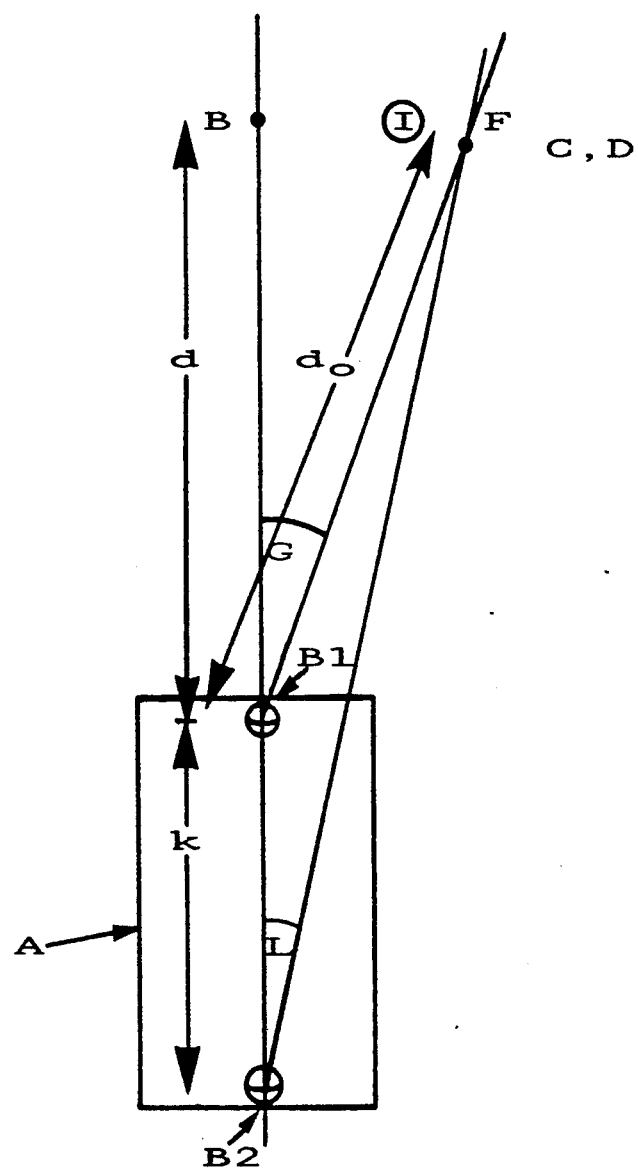
FIG. 2 shows the apparatus with its main axis pointing away by an angle G from the conductor.

In FIG. 2, the conductor bearing current [C-D] is seen as a point since it would physically come into and go out at right angles to the page. The conductor has also been rotated by an angle G about a circular path centered on $B_1$, from position B to position F to illustrate the capacity of the apparatus to compensate for the angle G. The apparatus A has its major axis $B_2$-$B_1$ pointing at B as in FIG. 1, while electrical conductor is actually at F. The angle G therefore represents the angular misalignment of apparatus A attempting to measure an electric current in conductor C-D and is introduced to display the capability of the microprocessor contained in A to compensate for such angular misalignment using the basic vectorial components $B_{1x}$, $B_{1y}$, $B_{1z}$, $B_{2x}$, $B_{2y}$ and $B_{2z}$. supplied by the two sets of triaxial transducers. The microprocessor proceeds to evaluate the current and distance of the conductor according to the procedure used when conductor was at B, assuming positions such as presented in FIG. 1, and the inaccuracy is corrected by the microprocessor using the readings available from coils $B_{2y}$ and $B_{1y}$, positioned within the apparatus A as they were in FIG. 1. Using the magnitude of $B_{2y}$ and $B_{1y}$, the ratio between the actual current $I_G$ and the current I calculated by the apparatus according to the above formulas which assume position of conductor at B can be shown by algebraic calculations using the law of cosines to be equal to $$I_G/I = 1/(((k^2 + d^2 - 2kd\cos G)/k^2 + kd\cos G) - d/(k\cos G))$$

with $d_o$, the true distance to the conductor being expressed as $$d_o = (k\cos G(\cos^2 L - 1))/(\cos^2 G - \cos^2 L) \times$$
$$[1 \pm (1 + (\cos^2 G - \cos^2 L)/(\cos^2 G(\cos^2 L - 1)))^{\frac{1}{2}}]$$

with $\cos G = B_{1y}/(B_{1x}^2 + B_{1y}^2 + B_{1z}^2)^{\frac{1}{2}}$ and $\cos L = B_{2y}/(B_{2x}^2 + B_{2y}^2 + B_{2z}^2)^{\frac{1}{2}}$.

The microprocessor first evaluates the values of cos G and cos L using the formulas above from the string of values $B_{1x}$, $B_{1y}$, $B_{1z}$, $B_{2x}$, $B_{2y}$ and $B_{2z}$ supplied by the ADC. The cos G and cos L values are then entered into the expressions above for $d_o$ and for the correction factor $I_G/I$; the microprocessor retrieves from memory the value of k, and proceeds to obtain correction values to alter the value of I which assumes a straight ahead conductor and to estimate the true distance $d_o$. The spacing between the two points at which the field determinations $B_1$ and $B_2$ are made, k, intervenes in the calculation of both the new distance do and in the correction factor $I_G/I$.

An entirely similar demonstration can be made for compensation of the rotation of the apparatus around the third angle, the compensation involving $B_{1z}$ and $B_{2z}$ rather than $B_{1y}$ and $B_{2y}$ in the cosine expressions above.

Therefore, one estimate assuming the conductor straight ahead and two successive angular corrections can yield the exact current in the conductor and exact conductor distance.

The microprocessor proceeds as the calculation is complete to output the results according to a format which may be indicated by the operator, to an LCD or similar display which can be read on the surface of the instrument.

Since microprocessors can effect the previous calculations at high speed, especially if programmed in machine language, and since some ADCs are able to convert tens of RMS values per second with excellent accuracy, it can be seen that the display can be updated a number of times per second, effectively giving the impression of a continuous reading. The effect of a constant reading being displayed in spite of substantial angle changes in the position of the instrument is of great practical value to the operator. The microprocessor is capable to compensate effectively for substantial angular shifts and can therefore produce current and distance readings that are accurate irrespective of apparatus orientation or distance between apparatus and conductor.

If the computation algorithm is examined in detail, it is found that because of idiosyncrasies of angular functions, the correction factor computation shows an inevitable dip in accuracy at + or − 50 degrees because of a limit in the computational accuracy of microprocessors. This is why I recommend that the angle within which the instrument should be aimed at the conductor should be limited to plus or minus 45 degrees of the true direction of the conductor. At angles exceeding these values, the display of the apparatus is blanked to prevent the display of erroneous data. Blanking of the display or similar warning to the operator is also practical if the microprocessor should determine from his numerical evaluations that the actual field suggests an angle larger than 50 degrees while the operator orients the instrument exactly at the conductor. In this case, the operator is automatically warned by the occurrence of blanking or by a warning of the presence of an interfering source.

The techniques described above result in an apparatus which can evaluate the electric current passing within a conductor and the distance of such conductor from the apparatus by roughly pointing the main axis of the apparatus at the conductor from any distance, within the limits of the apparatus' ability to detect magnetic fields. Assuming that the field of a single conductor is the only major influence on the pair of triaxial magnetic detectors of the apparatus, exact current and distance determinations are possible within a useful range of current values.

It has been found in practice that with an instrument of overall length only 27 cm on its main axis, and with a field detection accuracy of 1 nT, 2 mA is the detection limit of the apparatus when 20 cm distant from the conductor. In many applications, such as industrial ones, much larger currents are common, and currents can be detected accurately from much larger distances.

I claim:

1. An instrument designed to measure electric current flowing in a linear electrical conductor, the current thereby causing around the conductor a gradient of magnetic flux density, comprising
   a) two assemblies of three orthogonal magnetic transducers at a set distance from each other, said two assemblies of three transducers being aligned on an axis normal to the electric conductor carrying the current, each assembly being used for the determination of the local magnetic flux density components x, y, z at two different locations within the instrument, the magnetic flux density components x, y, z at each location being represented by three electrical signals given by the three transducers of the corresponding assembly respectively;
   b) means to shield each of said magnetic transducers against electric fields originating from the conductor passing the current to be measured; and
   c) means to process said signals, said means including:
      precision electronic amplifier circuitry for amplifying each of said six signals;
      multiplexer-Analog-to-Digital-Converter combination for digitizing each of the amplified signals; and
      a microprocessor, for finding the root-mean-square value of each of said six signals, generating from the root-mean-square values the vectorial sum of the components x, y, z at each assembly location to determine the amplitude value of the magnetic flux density vector at each said assembly location, processing the amplitude values of said magnetic flux density vectors determined at said assembly locations into an electric current value using the equation $$I = \frac{kB_1}{20\left(\frac{B_1}{B_2} - 1\right)}.$$

wherein $B_1$ represents the magnetic flux density vector at one of said assembly locations, $B_2$ represents the magnetic flux density vector at the other of said assembly locations and k is the distance between said assembly locations, and displaying said current value.

2. Instrument as defined in claim 1 wherein said microprocessor includes means for processing said six magnetic flux density components obtained from two said orthogonal magnetic transducer assemblies to derive the correct value of the electric current causing the magnetic flux densities, by the way of estimation by the microprocessor of the true position of the conductor based on the ratio of the magnitudes of magnetic flux density components picked up by individual shielded transducer coils to he magnitude of the said magnetic flux density vectors at the corresponding assemblies, even in the case wherein an angle between normal to the electric conductor carrying the current and axis defined between two orthogonal magnetic transducer assemblies is present.

* * * * *